(12) United States Patent
Hsu et al.

(10) Patent No.: US 6,259,135 B1
(45) Date of Patent: Jul. 10, 2001

(54) MOS TRANSISTORS STRUCTURE FOR REDUCING THE SIZE OF PITCH LIMITED CIRCUITS

(75) Inventors: Louis L. C. Hsu, Fishkill; Carl J. Radens, LaGrangeville, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/405,329

(22) Filed: Sep. 24, 1999

(51) Int. Cl.[7] .................. H01L 29/76; H01L 29/94; H01L 31/062; H01L 31/113; H01L 31/119
(52) U.S. Cl. .................. 257/331; 257/353; 257/401
(58) Field of Search .................. 438/155, 157, 438/164, 587; 257/202, 245, 330, 331, 332, 350, 353, 354, 506, 401

(56) References Cited

U.S. PATENT DOCUMENTS

| 3,791,024 | 2/1974 | Boleky, III ............ 438/152 |
| 4,054,895 | 10/1977 | Ham ................... 257/354 |
| 4,252,574 | 2/1981 | Fabula ................. 438/164 |
| 4,368,085 | 1/1983 | Peel ................... 148/33.3 |
| 4,393,572 | 7/1983 | Policastro et al. ........ 438/164 |
| 4,751,554 | * 6/1988 | Schnable et al. ............ 357/4 |
| 4,979,014 | * 12/1990 | Hieda et al. .............. 357/56 |
| 5,350,937 | * 9/1994 | Yamazaki et al. .......... 257/316 |
| 5,414,287 | * 5/1995 | Hong .................... 257/316 |
| 5,466,621 | 11/1995 | Hisamoto et al. .......... 438/155 |
| 5,580,802 | 12/1996 | Mayer et al. ............ 438/157 |
| 5,585,661 | 12/1996 | McLachlan et al. ........ 438/406 |
| 5,650,339 | 7/1997 | Saito et al. ............. 438/164 |
| 5,739,574 | 4/1998 | Nakamura ............... 257/401 |
| 5,747,839 | * 5/1998 | Hammond et al. .......... 257/253 |
| 5,773,874 | 6/1998 | Einthoven .............. 257/623 |

FOREIGN PATENT DOCUMENTS

401276669 * 11/1989 (JP) .
405343679 * 12/1993 (JP) .

* cited by examiner

Primary Examiner—Olik Chaudhuri
Assistant Examiner—Hoai Pham
(74) Attorney, Agent, or Firm—Daryl K. Neff; Todd M. C. Li

(57) ABSTRACT

An integrated circuit having modular scalable device widths based on vertical height of the devices above the substrate plane. Different device widths are obtained in the same circuit and on the same chip based on the depth of etch in making the vertical devices or on the parallel connection of multiple device gate widths. Thereby pitch limited circuits are made in a 3-dimensional form to increase packing density of pitch limited integrated circuits within a memory array.

5 Claims, 5 Drawing Sheets

MOS TRANSISTORS STRUCTURE FOR REDUCING THE SIZE OF PITCH LIMITED CIRCUITS

BACKGROUND OF THE INVENTION

1. Field of the Invention

The present invention relates to semiconductor devices and methods of manufacture, and more particularly, to an integrated circuit chip wherein different device widths of MOS transistors are obtained in the same circuit and on the same chip based on the depth of etch in a vertical direction.

2. Description of the Related Art

As very large scale integrated (VLSI) circuits become increasingly smaller, they eventually experience a physical limit set by the lithographic capability of their manufacture. In the past, 3-dimensional (3-D) transistor devices have been proposed to further shrink the packing density of integrated circuits. However, such techniques are very difficult to implement in any circuit other than an uniform array of memory cells. For example, in pitch-limited circuits, that is, the sense amplifier, row decoder, column decoder and other circuit elements needed for a memory integrated circuit can not be shrunk in the same manner as the individual memory cells. Therefore, the memory chip cell packing density can not be scaled down effectively. In implementing smaller cell sizes, such as six or seven times the minimum lithographic feature (6F or 7F square), there is not an overall DRAM chip area savings because the core or pitch limited circuits needed to access the memory cells can not be scaled proportionately when the pitch size is reduced.

SUMMARY OF THE INVENTION

The present invention is a new integrated circuit structure and method of manufacture for integrated circuit devices using 3-dimensional transistors to significantly shrink the pitch limited circuits of an integrated circuit chip. In a first embodiment, a plurality of gate widths can be obtained by forming silicon islands on a silicon substrate. Next, a gate dielectric is formed on the silicon islands followed by placement of gate electrodes upon the dielectric material. By electrically connecting one or more of the gate electrodes, individual transistors may be formed having different gate widths based on the number of gate electrodes connected. The structure of the integrated circuit permits pitch limited circuits to be scaled along with non pitch limited circuits.

In an alternative embodiment, different gate widths can be obtained by forming the silicon islands at a multiple of preselected heights. Different island heights results in varying gate width dimensions. Electrically connecting one or more of gate electrodes results in transistors having different gate widths based on the height of the silicon island. The total packing density of the integrated circuit containing pitch limited and non pitch limited circuits is thus improved.

BRIEF DESCRIPTION OF THE FIGURES

The present invention will be described with reference to the accompanied drawings wherein.

DETAILED DESCRIPTION OF THE PREFERRED EMBODIMENT

In the following description of the preferred embodiments, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention.

The illustrative embodiments described herein concern electrical circuitry which uses voltage levels to represent binary logic states—namely, a "high" logic level and a "low" logic level. Further, electronic signals used by the various embodiments of the present invention are generally considered active when they are high, however, an asterisk (*) following the signal name in this application indicates that the signal is negative or inverse logic. Negative or inverse logic is considered active when the signal is low.

Figure 1:
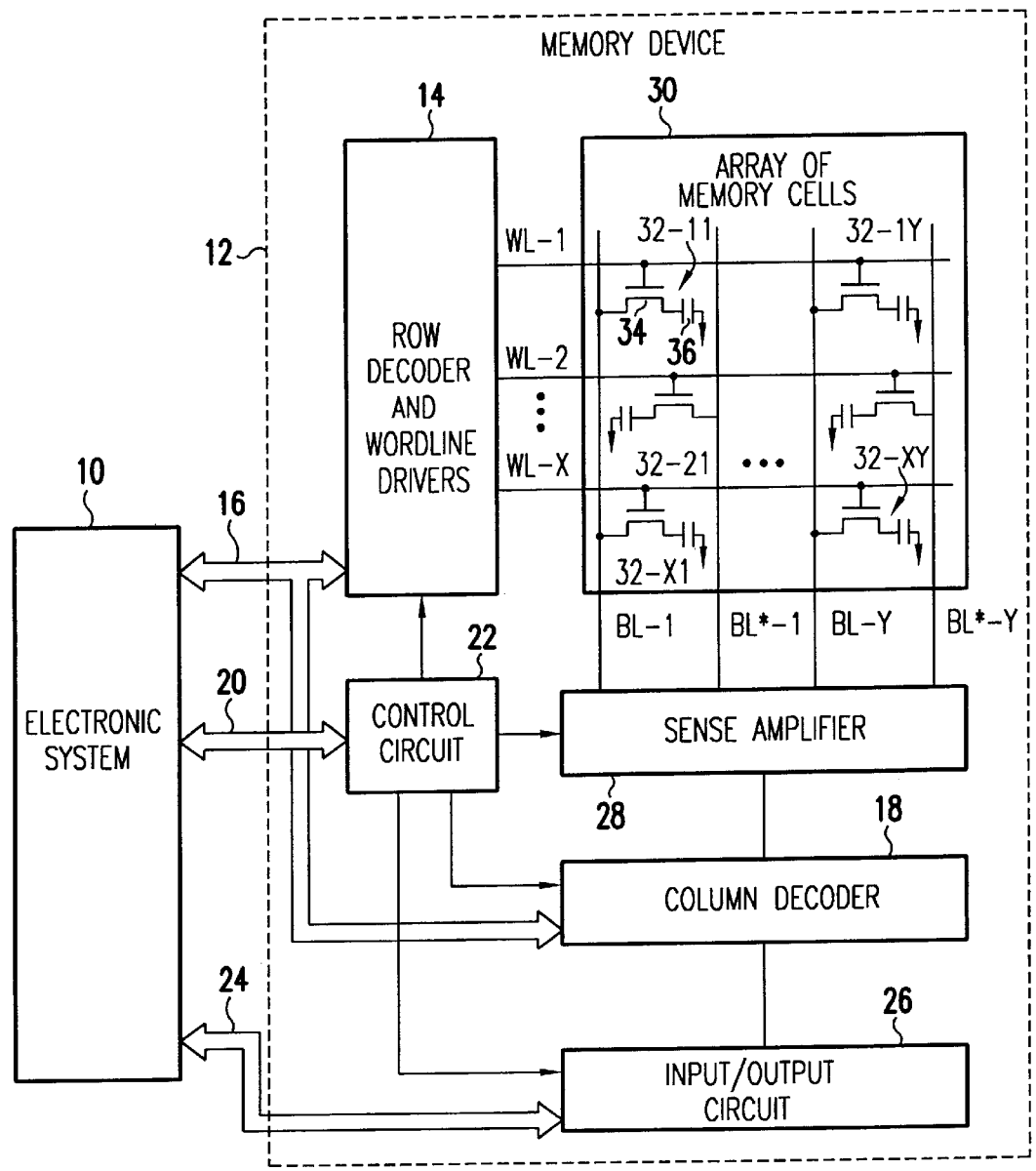
FIG. 1 is a block diagram illustrating a memory array for employing the method and structure of the present invention.

FIG. 1 is a block diagram of an illustrative embodiment of the present invention. Electronic system 10 is coupled to memory core circuit 12. Electronic system 10 comprises, for example, a microprocessor, memory controller, system clock generator, a chip set or other appropriate system that stores data in a memory device. Electronic system 10 is coupled to row decoder 14 of memory core circuit 12 through address lines 16. Address lines 16 also couple electronic system 10 to column decoder 18. Control lines 20 couple electronic system 10 to control circuit 22. Finally, input/output lines 24 couple electronic system 10 to input/output circuit 26.

Memory core circuit 12 further includes sense amplifier 28 and array of memory cells 30. Array of memory cells 30 includes a number of word lines, WL-1 through WL-X, a number of bit lines, BL-1 through BL-Y, and a number of complementary bit lines, BL*-1 through BL*-Y. Array of memory cells 30 is constructed so as to use a dynamic cell plate sensing scheme wherein each bit line, BL-i, is associated with a complementary bit line, BL*-i, to be used in reading and writing data into a memory cell. To this end, bit lines BL-1 through BL-Y and complementary bit lines BL*-1 through BL*-Y are coupled in complementary pairs (referred to as "bit line pairs") to sense amplifier 28. Further, word lines WL-1 through WL-X are coupled to row decoder 14.

Memory core circuit 12 is controlled by control circuit 22. Control circuit 22 is coupled to row decoder 14, sense amplifier 28, column decoder 18, and input/output circuit 26.

Array of memory cells 30 includes a number of memory cells 32-11 . . . 32-XY. Memory cell 32-11 is described herein by way of example. It is understood that the remaining memory cells are constructed in similar fashion.

Memory cell 32-11 includes access transistor 34 and capacitor 36. Access transistor 34 includes a gate that is coupled to word line WL-1, a drain region that is coupled to bit line BI-1 and a source region that is coupled to a node plate of capacitor 36. The ground plate of capacitor 36, is tied to ground or to a fix-voltage level.

Similarly, memory cell 32-21 also has an access transistor that includes a gate that is coupled to a different word line WL-2. The drain of the access transistor is coupled to the adjacent bit line BL*-1, which is the complementary bit line.

In operation, memory core circuit 12 reads and writes data for electronic system 10. For example, to read the value from memory cell 32-11, electronic system 10 provides control signals to control circuit 22 over control lines 20. Control circuit 22 provides signals to sense amplifier 28 that causes an equilibrate circuit of sense amplifier 28 to equilibrate the voltages on bit line BL-1 and complementary bit line BL*-1. The equilibrate circuit of sense amplifier 28 forces bit line BL-1 and BL*-1 to a common voltage, e.g., approximately halfway between the high and low logic values for array of memory cells 30.

Row decoder 14 selectively drives word line WL-1 to a high logic level to activate access transistor 34. When the voltage on word line WL-1 is a threshold voltage, $V_t$, above the equilibrate voltage level, a charge stored on capacitor 36 is shared with bit line BL-1. For example, if a high logic level is stored on capacitor 36, the voltage on bit line BL-1 increases. Additionally, by using complementary bit line in this manner, activation of access transistor 34 does not change the voltage on complementary bit line BL*-1 since WL-2 is not activated. With a charge difference on the bit line pairs, sense amplifier 28 amplifies the difference and detects the logic state of cell 32-11. Column decoder 18 receives the column address of the selected cell from electronic system 10. Column decoder 18 identifies the appropriate bit line pair for sense amplifier 28 to use in reading the value from memory cell 32-11. Sense amplifier 28 senses and amplifies the difference in voltage in the bit line pair and thus produces high and low logic levels on complementary nodes of sense amplifier 28 that correspond to the sensed bit line and complementary bit line, respectively. These voltage levels are passed to electronic system 10 through input/output circuit 26 over input/out lines 24. In the meantime, the logic state originally stored in the cell is also written back before the read operation is completed.

In a write operation, electronic system 10 provides data and address to be written to, for example, memory cell 32-11 over input/output lines 24 to input/output circuit 26. Column decoder 18 receives the column address from electronic system 10 over address lines 16 to select the appropriate bit line/plate line pair for the selected memory cell, e.g., BL-1, BL*-1. Sense amplifier 28, under the control of control circuit 22, forces the bit line/plate line pair for memory cell 32-11 to complementary high and low logic levels based on the data to be stored in memory cell 32-11. Row decoder 14 receives an address from electronic system 10 over address line 16 that indicates the appropriate word line to activate for this storage operation. When word line WL-1 is activated, access transistor 34 causes the data on bit line BL-1 and complementary bit line BL*-1 to be stored on capacitor 36. In this process, the high and low logic levels for sense amplifier 28 are translated to appropriate voltage levels for memory cell 32-11.

As depicted in FIG. 1, the array of memory cells 30 can be scaled to be of minimum size while the sense amplifier 28, row decoder 14, which includes word line drivers, and column decoder 18 must have certain size transistors to provide sufficient current drivability for reading and writing to maintain memory performance. Therefore, these pitch limited circuits can not be scaled as the memory array gets smaller. To overcome this problem the three dimensional methods and structure of the present invention are used.

Illustrated in FIG. 2 are the basic processing steps needed to implement the present invention. These are commonly known in the art and are used as an example of a possible implement of the invention. Starting in FIG. 2A there is shown a bulk silicon substrate 40 on which is formed a silicon island 42 using a silicon nitride mask 44. The etching used to form the island can be done by a number of etching techniques, including plasma or reactive ion etching. It is preferred that the island be formed at an angle, e.g., 83–88°, to the substrate surface, noted at 45, to allow for later deposition of material in a conformal manner and to ease patterning of the deposited material.

Next, a sidewall spacer 46, is formed on the sidewalls of the silicon island 42. The spacer material can also be silicon nitride which prevents oxidation of the silicon island 42. It is important that the top nitride mask 44, has sufficient thickness to prevent oxidation of the top of the silicon island 42. Next, a field oxide is grown on the exposed silicon surfaces as shown in FIG. 2C. The field oxide 48 is used to isolate transistors on the silicon island. Next, as shown in FIG. 2D, the masking material, silicon nitride 44 and 46, is stripped off the silicon island 42, and ion implantation is used to dope the body of the substrate 40 and separately, to tailor the threshold voltage (Vt) doping on the silicon island 42. This is followed by growth of the gate oxide 50.

Figure 2A:
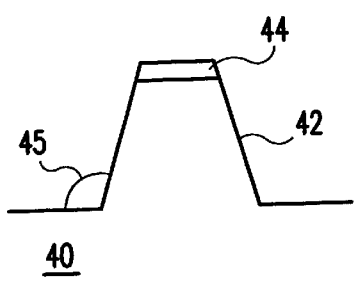
FIG. 2A through FIG. 2H are cross sectional views of the formation of a transistor according to the present invention, FIG. 2H being a perspective cross sectional view.
Figure 2E:
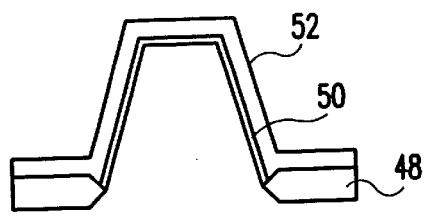
Figure 2B:
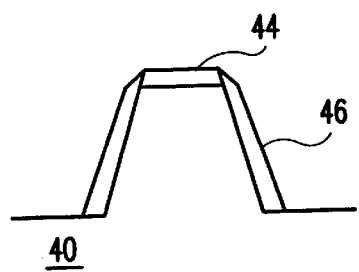
Figure 2F:
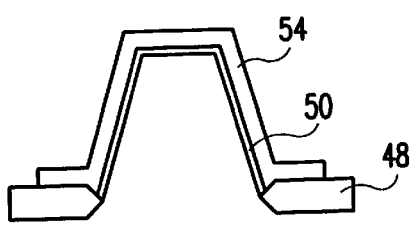
Figure 2C:
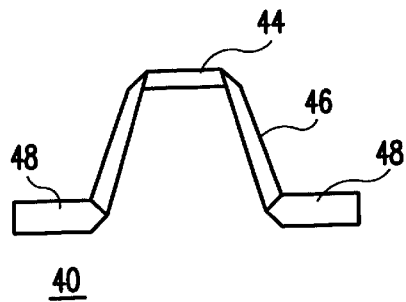
Figure 2G:
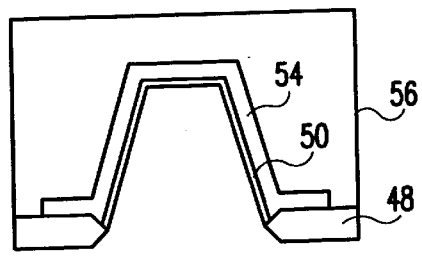
Figure 2D:
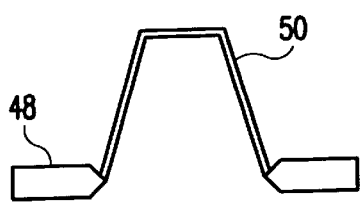
Figure 2H:
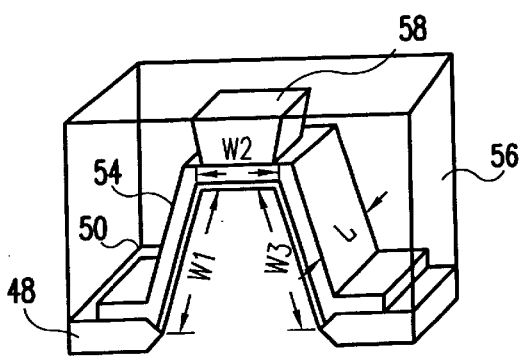

As shown in FIG. 2E, the gate electrode material such as doped polysilicon 52, is deposited over the surface of the silicon in a conformal manner. Patterning of this gate material is illustrated in FIG. 2F using a selective etching recipe which stops at the field oxide 48 and gate oxide 50. The patterned gate electrode 54 is thereby formed. A thick dielectric material 56 is next deposited as shown in FIG. 2G to passivate and planarize the surface of the silicon island 42. Electrical contact via 58, is made to the gate electrode 54, as shown in FIG. 2H. As shown, the width of the gate of the MOS transistor is the sum of W1 +W1 +W3, while the gate length is L. By proper selection of the depth of the etch, the gate width can be accurately controlled.

The width of all devices is the same if the etch depth has been uniform. Uniform depth can be easily achieve when using silicon-on-insulator (SOI) substrates, but also can be obtained by accurately controlling the depth of etching on a bulk silicon substrate. Again, a proper etched angle is desirable when forming the silicon-islands etching since it is easier for later polysilicon gate etching, as well as for source and drain doping to follow.

To achieve devices having variable channel width, two methods are proposed. A sense amplifier circuit is used as an example to demonstrate how to achieve a high layout packing density of devices. In a first embodiment, it is proposed to etch the silicon to a uniform depth and join the silicon islands in parallel. To obtain different channel widths the gate material is run across a number of the islands. In the present case, the sense amplifier, the width of the multiplexer switch device, as well as the precharge and equalization device, can be 1.2 micron, the width of the p-channel latch can be 3.6 microns and a width of the n channel latch device can be 4.8 microns. If the thickness of the silicon-island W2 is 0.25 microns, then etching the silicon to a depth (W1 or W3) of 0.5 microns and wrapping the gate over one silicon-island, will result in about 1.2 micron channel width. Similarly, placing three silicon islands in parallel will sum up to 3.6 microns to form a p-latch and four in parallel would equal 4.8 microns to form a n-latch within the sense amplifier.

Figure 3A:
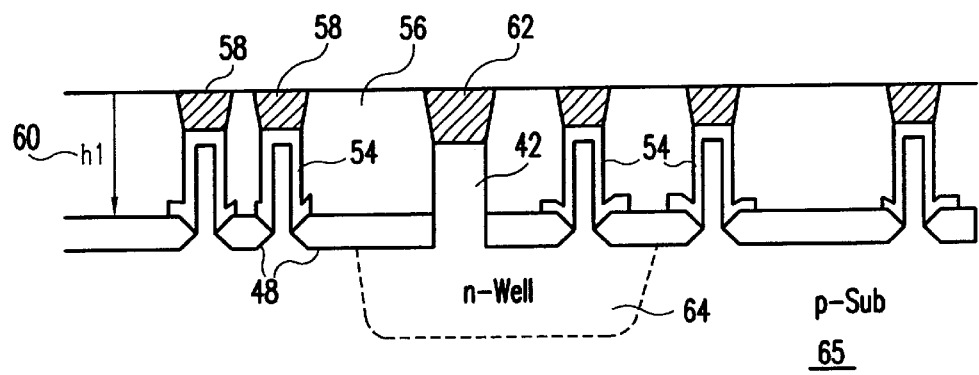
FIG. 3A is a cross sectional view of the layout for uniform depth etch implementation of the present invention.
Figures 4A, 4B:
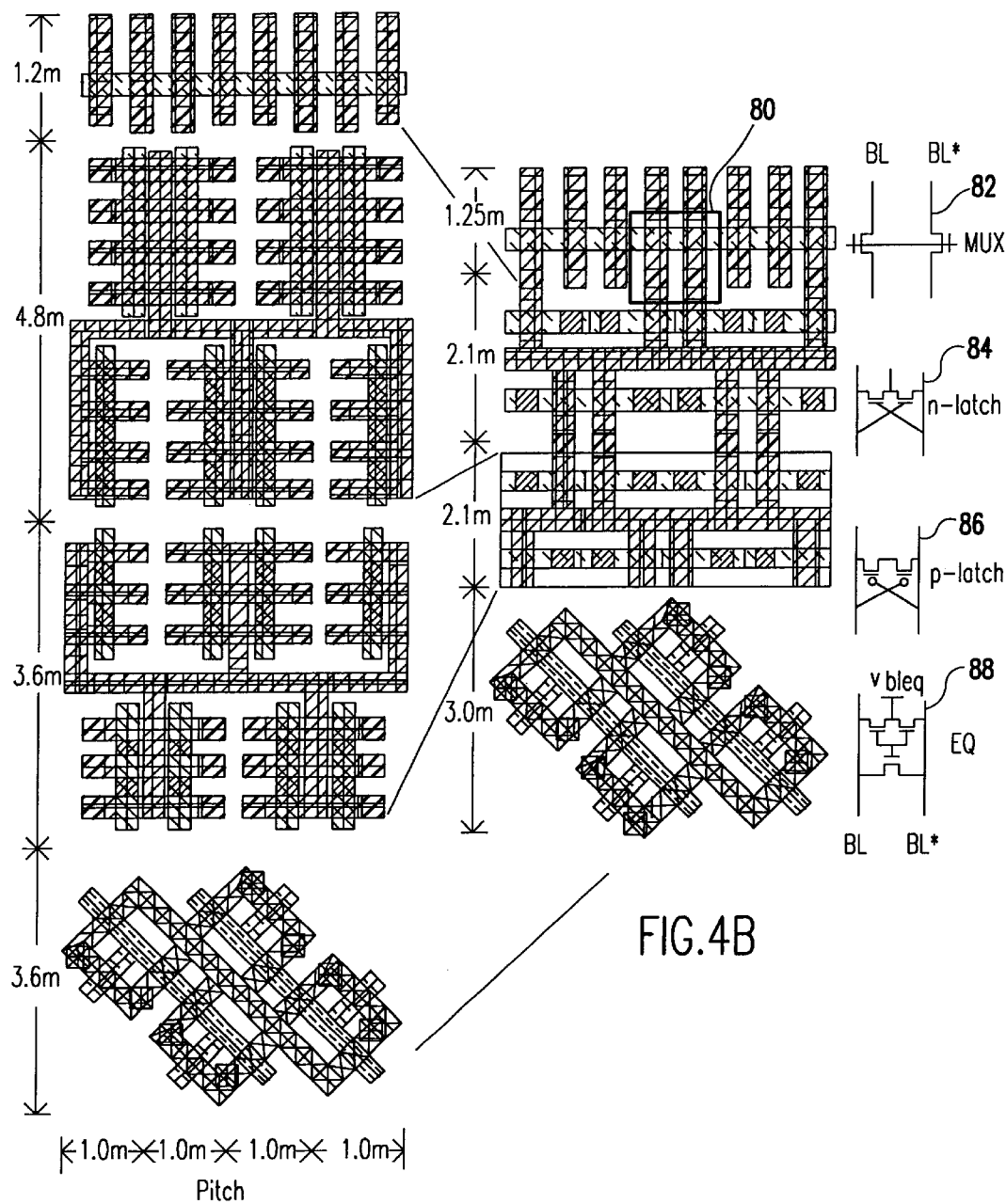
FIG. 4A illustrates a top view of the layout of the design of a uniform depth sense amplifier.
FIG. 4B illustrates a top view of the layout of the design of a multidepth sense amplifier.

The new layout scheme is shown in FIG. 4A which forms a sense amplifier having 1.0 micron pitch using 0.25 micron grounds rules as a minimum pitch size. Here, the pitch size is the horizontal dimensional of a sense amplifier. The overall length, or the vertical dimension of the sense amplifier layout is about only 15 microns. A cross-sectional view of this method is shown in more detail in FIG. 3A.

In FIG. 3A, the islands are etched to a uniform depth 60, represented by $I_1$. Therefore, each crossover between an active area formed by the silicon-island in a polysilicon strap is one MOS transistor device. The n-well contact 62 makes contact with the substrate in n-well region 64. The contact can be made on a dummy silicon island 42. Substrate contact to the p-type silicon wafer 65, can also be done in a similar way is not shown in this drawing.

In a second embodiment, different device widths can be obtained by etching the silicon substrate to different depths 60, 70 and 72, represented by depths $I_1$, $I_2$ and $I_3$, respectively. To do so requires more process steps, although the alignment for the masking steps used to selectively etch regions at varying depths is not critical. The overall packing density of the integrated circuit is thus further improved.

Figure 3B:
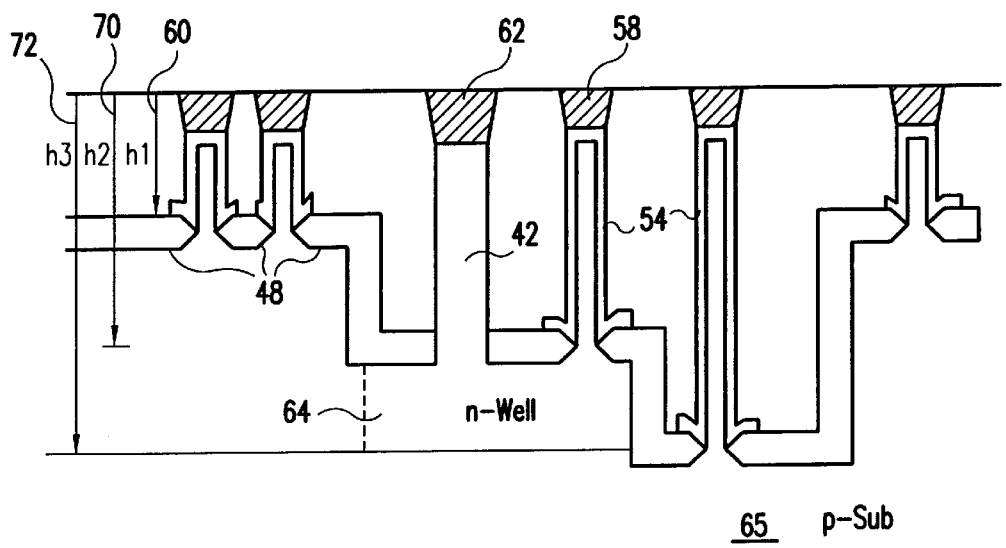
FIG. 3B is a cross sectional view of the layout for a multi-depth etch implementation of the present invention.

For the same sense amplifier as shown in FIG. 4A, can now be formed in about only 8.5 microns length as shown in FIG. 4B. Compared to 15 microns from the approach described in the first embodiment, there is a 43% of area saving. A cross-sectional view of the multiple depth device is shown in FIG. 3B.

Figure 5A:
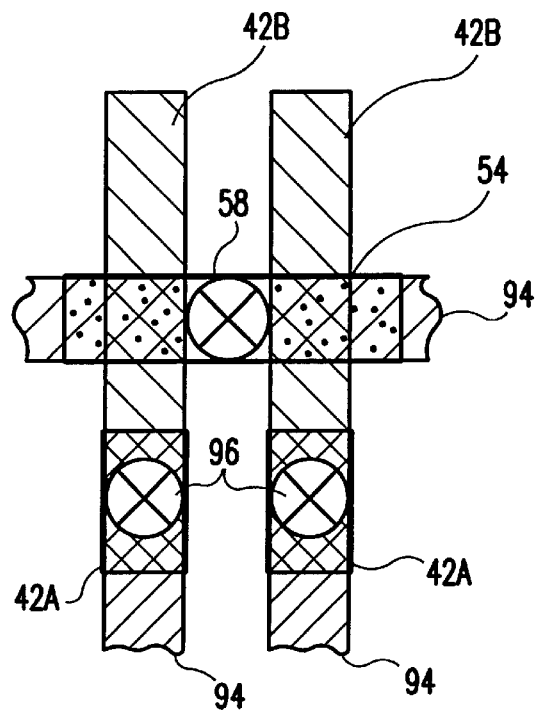
FIG. 5A illustrates a top view of the "mux" portion of FIG. 4B.
Figure 5C:
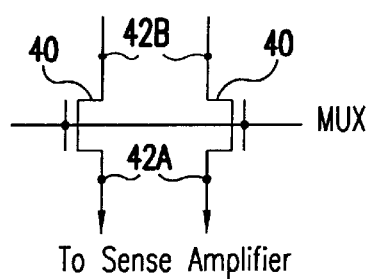
FIG. 5C is a circuit schematic of the "mux" portion of FIG. 4B.
Figure 5B:
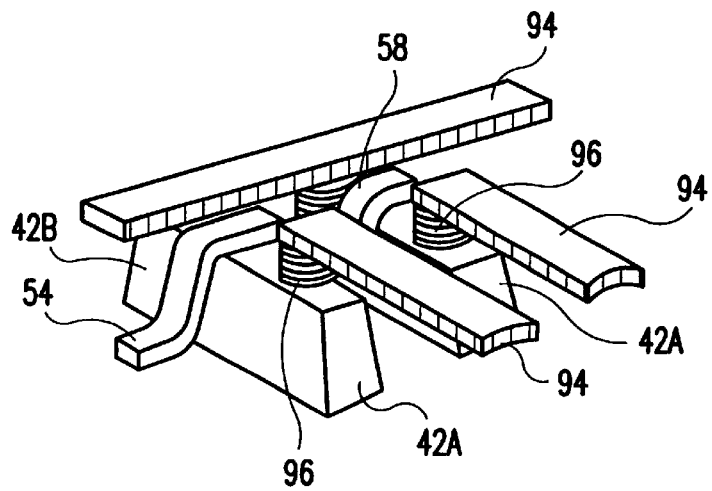
FIG. 5B is a perspective cross sectional view of the "mux" portion of FIG. 4B.

A detailed look of a section 80 of FIG. 4B can be seen in FIG. 5. FIG. 5A illustrates two islands 42 crossed over by gate electrode 54. Electrical contact is made to the gate through via 58 by the local interconnect metal 94, which may be tungsten or a silicide conductor. Metal conductor contact is made to the source regions of the transistor 42A through via openings 96. This forms two multiplexer switches and two bit lines electrically connected to the drains 42B of the multiplexer devices. A 3-dimensional view of this circuit is depicted in FIG. 5B where metal 94 contacts the gate electrode through via 58. The source/drain regions of the transistor are electrically contacted though vias 96 by metal 94.

The corresponding circuits schematic is shown in FIG. 5C. Two MOS transistors 40 are formed by the cross over of the gate material 54 and two silicon islands 42. These transistors are used as switches, the source side of the transistor 42A is connected to the sense amplifier. While the drain side of the transistors 42B are connected to the bit line pair. A MUX signal is generated in the control circuit 22 of FIG. 1 to select specific groups of bit line pairs to be connected to the corresponding sense amplifiers, so that data can be read or write between cells and the I/Os. The source and the drain of the switch devices are reversible depending whether it is the read or write operation.

The first embodiment having a uniform etch depth is easier to implement and readily adapted to silicon-on-insulator (SOI) technology. In SOI, the silicon layer determines the island depth of the active device since the process to fabricate the 3-D SOI is almost identical to a uniform etch process. The depth will be very uniform.

The layout of FIG. 4B operates as a sense amplifier. Shown in FIG. 4B is multiplexer 82, n-channel latch 84, p-channel latch 86 and equalizer circuitry 88. These operate on bit line pairs to read and write into the memory array.

Each of the layouts consists of four sense amplifier units with a width (or pitch size) of 1 $\mu$m with 0.25 $\mu$m ground rule. The total length or vertical layout dimension of a sense amplifier using the first embodiment as shown in FIG. 4A is 15 $\mu$m, while using the multiple depth etch embodiment shown in FIG. 4B produces a sense amplifier having a length of only about 8.5 $\mu$m.

The first portion of the sense amplifier is the MUX, which has been described in detail in FIG. 5. The size of the MUX is the same for both embodiments, since both use 1.2 $\mu$m width devices, and therefore only one silicon island is needed.

The second portion of the sense amplifier is a n-type sense latch 84, sometimes simply called n-latch. The n-latch consists of two n-MOS devices. The drain sides of two nMOSs are connected and tied to a common node. The sources of them, one is tied to the bitline, and the other one is tied to the complementary bitline. The gates of them are tied to the opposite bitlines. When a signal in the bitline pair starts to develop and up to a certain level, a current will be drawn through the common node, this will speed up the signal separation. The operation is called ground sensing. Since in this example, a width of 4.8 $\mu$m of nMOS devices is needed to form n-latch, the first embodiment requires four islands for one nMOS, and another four islands for the second nMOS. The first nMOS and the second nMOS are stacked in the vertical direction. However, in the second embodiment, the silicon can be etched to a depth that is 4 times deeper than those of MUX devices. Therefore, as shown in FIG. 4B, there is a significant area saving when employing the varying depth approach.

The third portion of the sense amplifier is p-type sense latch 86, often called p-latch. Similarly, the p-latch 86, consists of two p-MOS devices. The drain sides of two pMOS are connected and tied to a common node. The sources of them, one is tied to the bitline, and the other one is tied to the complementary bitline. The gates of the p-latch are tied to the opposite bitlines. When a signal in the bitline pair starts to develop and at a certain level, a current will be withdrawn through the common node from a supply voltage, this will speed up the signal separation. The operation is called Vdd sensing. Since in this example, a width of 3.6 $\mu$m of pMOS devices is needed to form p-latch 86, using the first embodiment requires three islands for one pMOS, and another three islands for the second pMOS. The first pMOS and the second pMOS are stacked in the vertical direction. However, using the second embodiment, the silicon can be etched to a depth that is 3 times deeper than those of MUX devices. Therefore, as shown in FIG. 4B, a significant area saving can be achieved employing the varying etch depth approach.

The last portion of the sense amplifier is the equalization block 88, or called EQ. The block consists of three n-MOS devices. The gate of the three nMOSs are tied together which is controlled by a signal from the control circuit 22 shown in FIG. 1. When bitline pairs need to be equalized, a signal will be sent to the equalization block to activate the equalization operation. The first two nMOSs are connected with their drains tied to a supply Vbleq, or an intermediate bit-line level. The sources of them, one is tied to bitline, and the other one is tied to the complementary bitline. The third nMOS has its source and drain tied to each bit line of the bitline pair. When the equalization signal is received, two bitlines from the bitline pair are shorted together first, and then they both are fed to the Vbleq supply. This will bring both bitlines to the Vbleq level.

Since, in this example, a width of 1.2 μm of nMOS device is needed to form the equalization circuit the layer shape and size between the two embodiments are identical.

An estimation of the area saved can be made based on a 1 Gigabit DRAM. The physical dimension of a 64-meg unit within a 1 Gigabit DRAM has a sense amplifier to array ratio of about 9 percent. The memory array to chip ratio is about 67.5%. Therefore, the sense amplifier occupies approximately 6.1% of the total chip area. Using the new layout, the sense amplifier will shrink the percentage to less than 2%. Therefore, the overall chip area saving just by implementing the new method to the sense amplifier results in a savings of 4%. Cell efficiency using the described techniques can produce high density memory cells via a 3-dimensional technique.

While the invention has been particularly shown and described with reference to preferred embodiments thereof, it will be understood by those skilled in the relevant art that various changes in form and details may be made without departing from the spirit and scope of the invention.

What is claimed is:

1. A semiconductor integrated circuit structure having a plurality of gate widths contained therein, comprising:

silicon islands formed at multiple preselected heights on a silicon substrate;

gate dielectric formed on said islands;

gate electrodes formed on said dielectric on said islands; and one or more gate electrodes being electrically connected to form respective individual transistors having different gate widths based upon said multiple preselected heights at which said silicon islands are formed.

2. The integrated circuit of claim 1 wherein said multiple heights of said silicon islands produce transistors having integer multiple gate widths.

3. The integrated circuit of claim 1 further comprising electrical interconnections of said individual transistors to form pitch limited circuits for a memory array of the type consisting of row decoder, wordline driver, sense amplifier and column decoder circuit blocks.

4. The integrated circuit of claim 3 wherein said pitch limited circuits are formed simultaneously with support circuits comprising transistor devices built on etched silicon islands.

5. The integrated circuit of claim 3 wherein said pitch limited circuits are formed having the same pitch dimension as circuits of a memory array electrically interconnected with said pitch limited circuits.

* * * * *